(12) United States Patent
Takase

(10) Patent No.: US 10,855,265 B2
(45) Date of Patent: Dec. 1, 2020

(54) COMPARISON CIRCUIT

(71) Applicant: Murata Manufacturing Co., Ltd., Nagaokakyo-shi, Kyoto-fu (JP)

(72) Inventor: Yasuhide Takase, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/672,559

(22) Filed: Nov. 4, 2019

(65) Prior Publication Data

US 2020/0067499 A1 Feb. 27, 2020

Related U.S. Application Data

(63) Continuation of application No. PCT/JP2018/019598, filed on May 22, 2018.

(30) Foreign Application Priority Data

May 23, 2017 (JP) .................. 2017-102180

(51) Int. Cl.
*H03K 5/24* (2006.01)
*H03F 3/45* (2006.01)

(52) U.S. Cl.
CPC ........ *H03K 5/2481* (2013.01); *H03F 3/45183* (2013.01); *H03K 5/24* (2013.01); *H03K 5/249* (2013.01)

(58) Field of Classification Search
CPC .... H03K 5/2472; H03K 5/2481; H03K 5/249; H03F 3/45183; H03F 2203/45652
See application file for complete search history.

(56) References Cited

U.S. PATENT DOCUMENTS 8,362,934 B2   1/2013  Matsuzawa et al.
8,487,659 B2   7/2013  Kapusta
(Continued)

FOREIGN PATENT DOCUMENTS

JP        63-103513 A       5/1988
JP        2007-336051 A    12/2007
JP        2010-109937 A     5/2010

OTHER PUBLICATIONS

Schinkel et al., "A Double-Tail Latch-Type Voltage Sense Amplifier with 18ps Setup+Hold Time, ISSCC, Analog Techniques and PLLS", 17.7, 2007, p. 314-315 and p. 605.

(Continued)

*Primary Examiner* — Patrick O Neill
(74) *Attorney, Agent, or Firm* — Keating & Bennett, LLP

(57) ABSTRACT

A comparison circuit includes a preliminary amplification circuit that amplifies a voltage difference between a first input voltage and a second input voltage and a latch circuit that compares magnitudes of the first input voltage and the second input voltage according to the amplified voltage difference and latch a comparison result. The preliminary amplification circuit converts the first input voltage and the second input voltage input with the falling edge timing of a clock signal into a first control signal and a second control signal, respectively that return from the reversal state at respective speeds corresponding to the first input voltage and the second input voltage. The latch circuit compares the first input voltage and the second input voltage according to the first control signal and the second control signal.

15 Claims, 10 Drawing Sheets

(56) References Cited

U.S. PATENT DOCUMENTS 9,455,695 B2* 9/2016 Kull .................. H03K 5/249
2011/0215959 A1 9/2011 Matsuzawa et al.

OTHER PUBLICATIONS

Official Communication issued in International Patent Application No. PCT/JP2018/019598 dated Jul. 10, 2018.
Bekal et al., "An Improved Dynamic Latch Based Comparator for 8-bit Asynchronous SAR ADC", IEEE Computer Society Annual Symposium on VLSI, 2015, p. 178-182.

* cited by examiner

FIG. 1
Prior Art
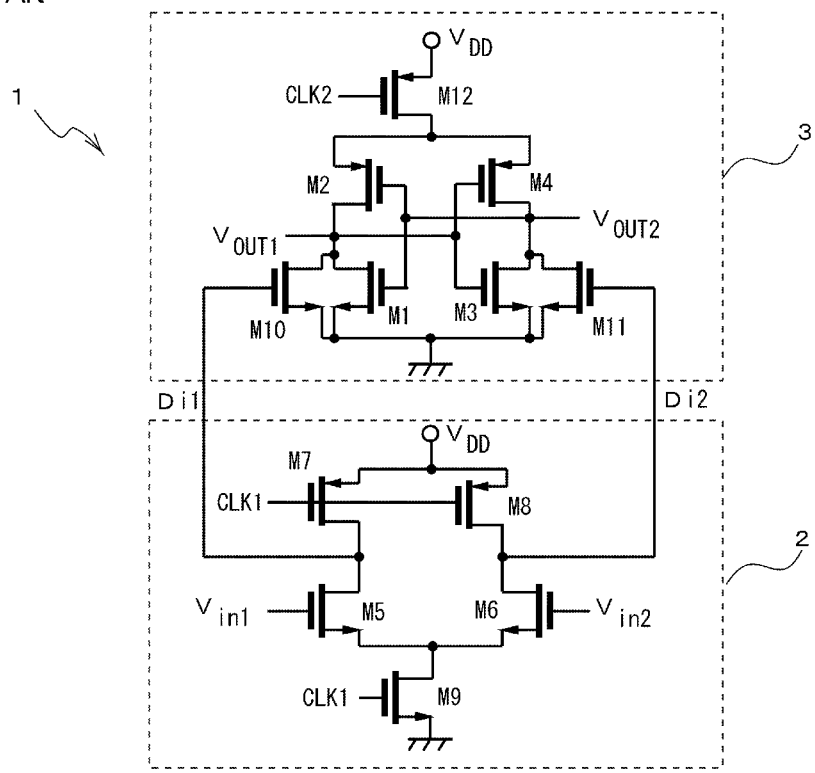
FIG. 2A
Prior Art
CLK
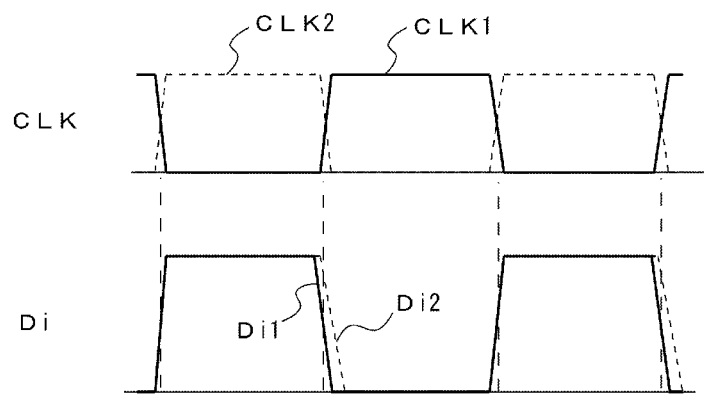
FIG. 2B
Prior Art
Di
FIG. 2C
Prior Art
Vout
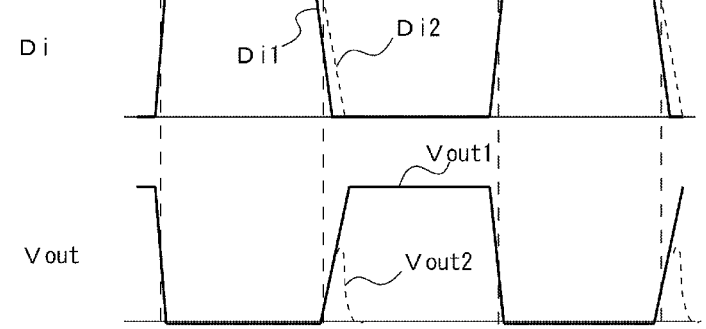

FIG. 5A
Prior Art
FIG. 5B
Prior Art
FIG. 5C
Prior Art
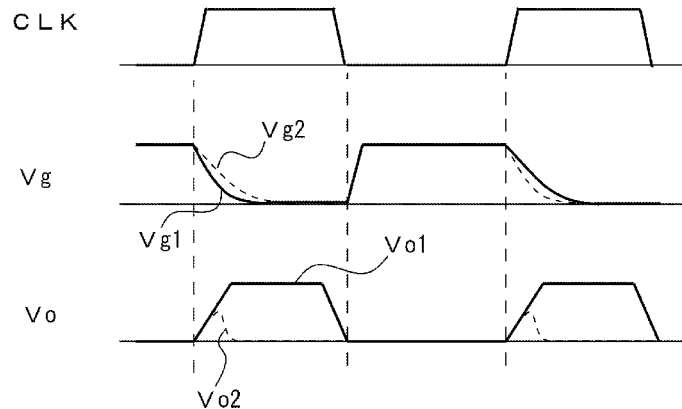
FIG. 6
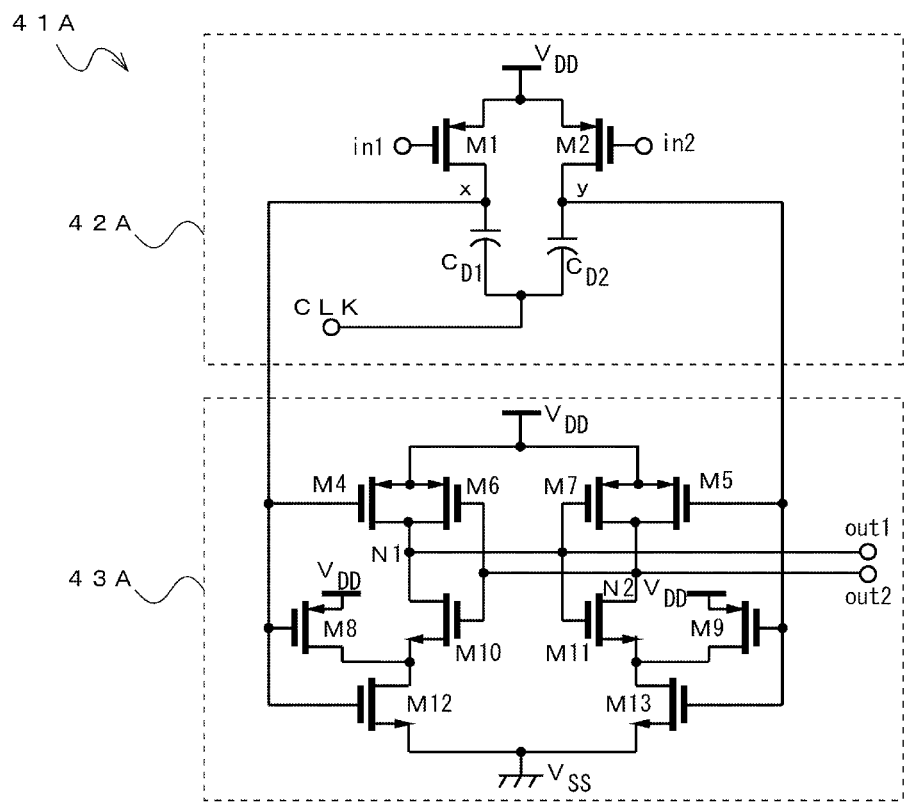

FIG. 7A  CLK
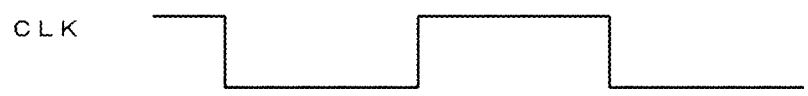
FIG. 7B  Vx, Vy
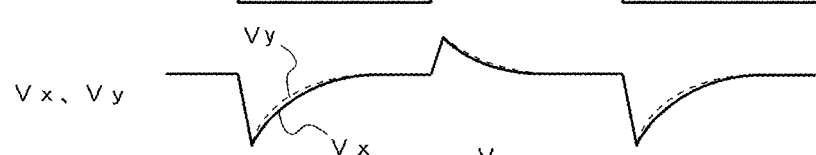
FIG. 7C  $V_{out1}$, $V_{out2}$
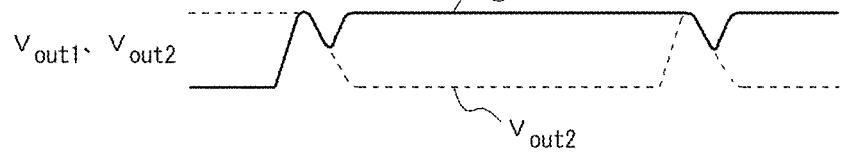
FIG. 8
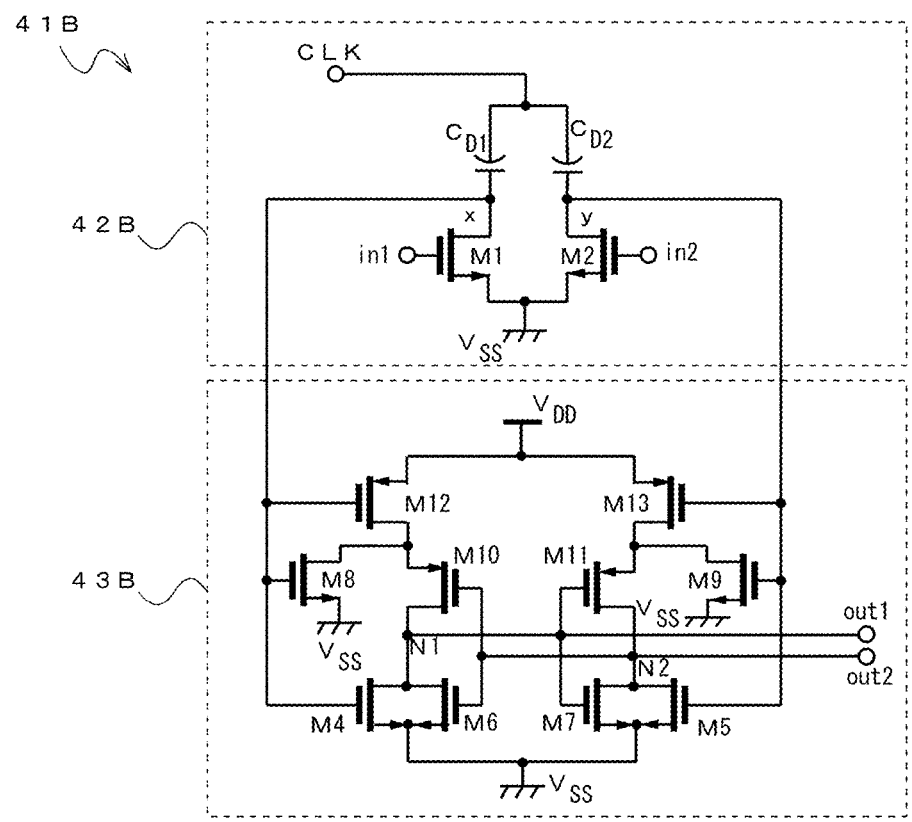

FIG. 9A  CLK
FIG. 9B  Vx、Vy
FIG. 9C  $V_{out1}$, $V_{out2}$
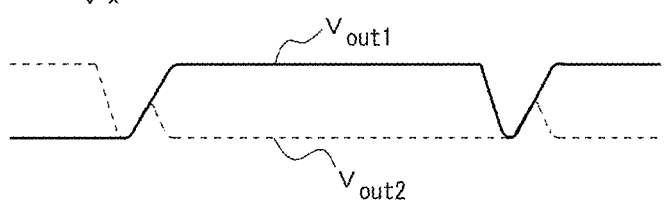
FIG. 10
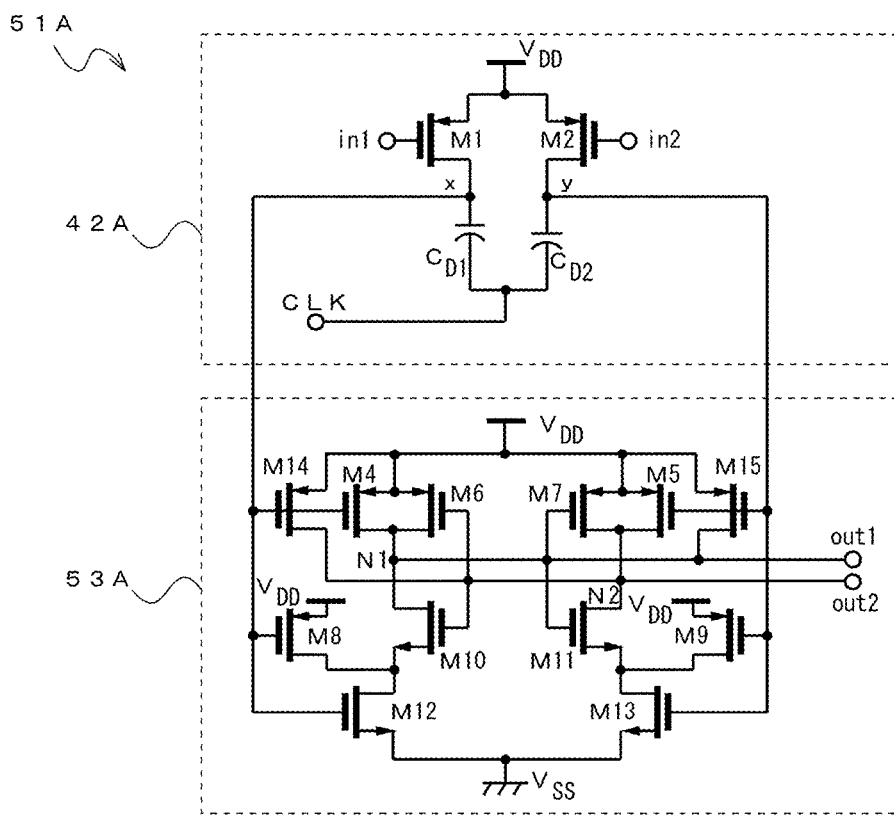

FIG. 12
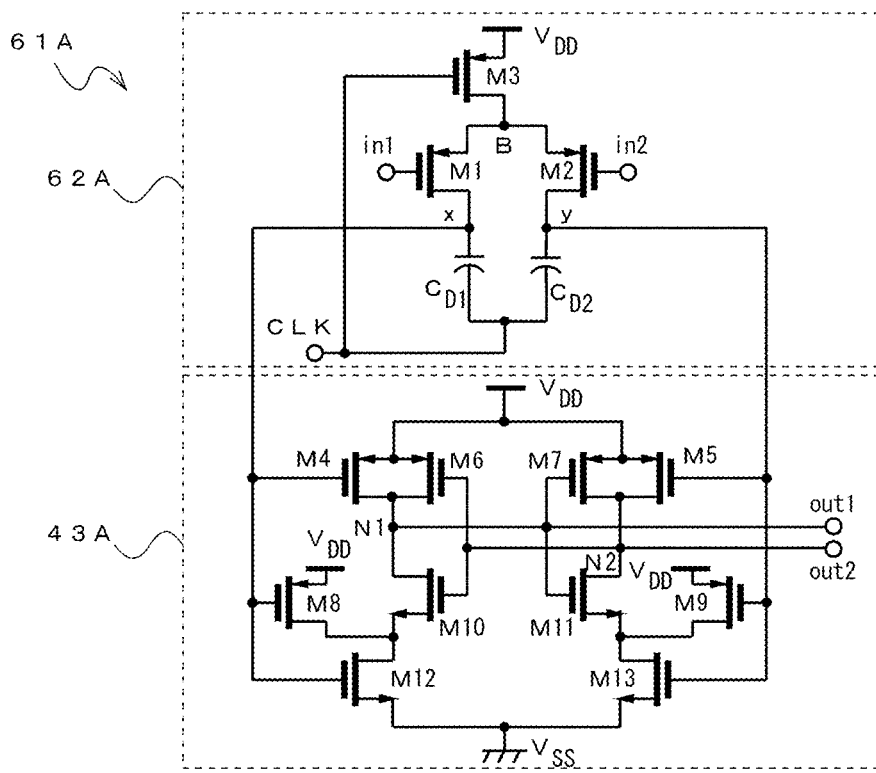
FIG. 13A  CLK
FIG. 13B  $V_x$, $V_y$, $V_B$
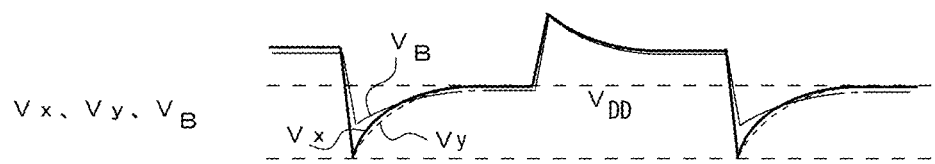
FIG. 13C  $V_{out1}$, $V_{out2}$
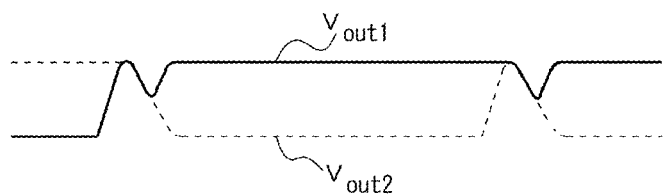

FIG. 14
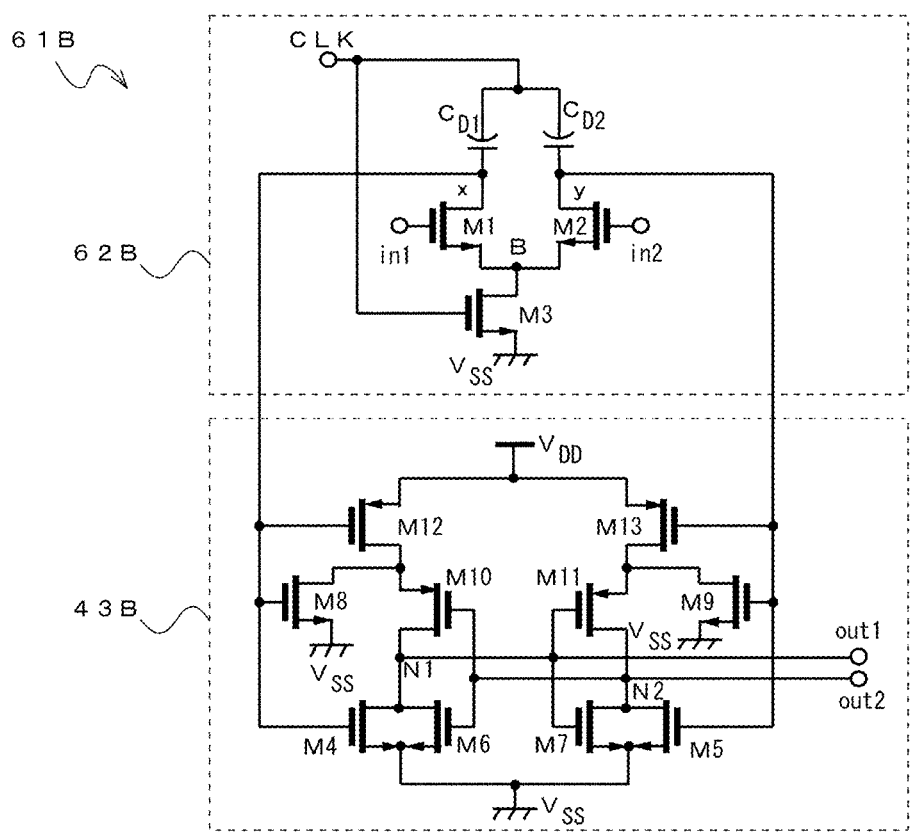
FIG. 15A  CLK
FIG. 15B  $V_x, V_y, V_B$
FIG. 15C  $V_{out1}, V_{out2}$
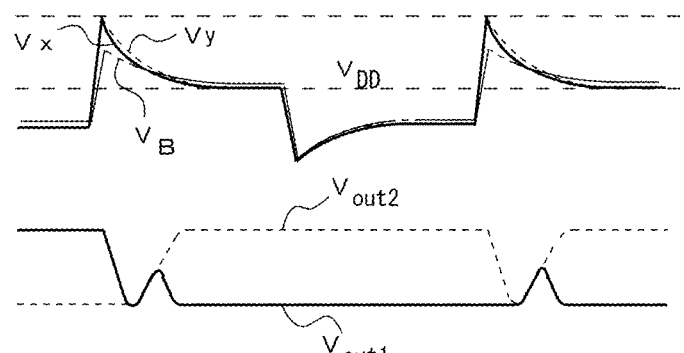

COMPARISON CIRCUIT

CROSS REFERENCE TO RELATED APPLICATIONS

This application claims the benefit of priority to Japanese Patent Application No. 2017-102180 filed on May 23, 2017 and is a Continuation Application of PCT Application No. PCT/JP2018/019598 filed on May 22, 2018. The entire contents of each application are hereby incorporated herein by reference.

BACKGROUND OF THE INVENTION

1. Field of the Invention

The present invention relates to a comparison circuit that compares the magnitudes of a first input voltage and a second input voltage and outputs a result of the comparison.

2. Description of the Related Art

Examples of this kind of comparison circuits include a double-tail latch-type comparator 1 disclosed in Bram Nuata et al., "A Double-Tail Latch-Type Voltage Sense Amplifier with 18 ps Setup+Hold Time", IEEE International Solid-State Circuits Conference 2007, Session 17, Analog Techniques and PLLs, 17.7 (see FIG. 1). The comparator 1 includes an input stage portion 2 and a latch portion 3. The input stage portion 2 includes NMOS transistors M5, M6, and M9 and PMOS transistors M7 and M8. Input voltages $V_{in1}$ and $V_{in2}$ are input into the gates of the NMOS transistors M5 and M6, respectively, and a first clock signal CLK1 is input into the respective gates of the PMOS transistors M7 and M8 and the NMOS transistor M9, so that the input stage portion 2 operates. The input stage portion 2 functions as a preamplifier having a signal gain. The latch portion 3 includes NMOS transistors M1, M3, M10, and M11 and PMOS transistors M2, M4, and M12. A second clock signal CLK2 is input into the gate of the PMOS transistors M12. The comparator 1 outputs output voltages $V_{out1}$ and $V_{out2}$ as a result of the comparison between the input voltages $V_{in1}$ and $V_{in2}$.

FIGS. 2A to 2C are timing charts representing the clock signals CLK1 and CLK2, voltages at respective nodes $D_{i1}$ and $D_{i2}$, and the output voltages $V_{out1}$ and $V_{out2}$ in the case of $V_{in1} > V_{in2}$. The output voltages $V_{out1}$ and $V_{out2}$ are determined in accordance with discharge speeds at the nodes $D_{i1}$ and $D_{i2}$ that are changed in accordance with the magnitudes of the input voltages $V_{in1}$ and $V_{in2}$.

Examples of the above-described kind of comparison circuits also include a comparator 4 disclosed in U.S. Pat. No. 8,487,659 (see FIG. 3). The comparator 4 includes a preamplifier circuit 5, a latch circuit 6, and a delay circuit 7. A difference voltage IN between two input voltages is input into the preamplifier circuit 5. The preamplifier circuit 5 amplifies the difference voltage IN in response to a first clock signal CLK1. The latch circuit 6 outputs an output voltage OUT as a result of the comparison between the input voltages in accordance with the difference voltage IN in response to a second clock signal CLK2. The delay circuit 7 causes a delay between the first clock signal CLK1 and the second clock signal CLK2 according to circuit conditions. This delay is set to an appropriate value in accordance with the changes in, for example, the ambient temperature of a circuit, a supply voltage value, and a manufacturing process.

Examples of the above-described kind of comparison circuits also include a comparator 10 disclosed in U.S. Pat. No. 8,362,934 (see FIG. 4). The comparator 10 includes a differential preamplifier circuit portion 20 and a differential latch circuit portion 30. The differential preamplifier circuit portion 20 includes three NMOS transistors 21 to 23 and two PMOS transistors 24 and 25. The differential preamplifier circuit portion 20 amplifies a difference voltage between input voltages $V_{i1}$ and $V_{i2}$ in response to a clock signal CLK and outputs voltages $V_{g1}$ and $V_{g2}$. The differential latch circuit portion 30 includes six NMOS transistors 31 to 34, 39, and 40 and four PMOS transistors 35 to 38. The differential latch circuit portion 30 outputs output voltages $V_{o1}$ and $V_{o2}$ as a result of the comparison between the input voltages $V_{i1}$ and $V_{i2}$ in accordance with the voltages $V_{g1}$ and $V_{g2}$ input thereinto.

FIGS. 5A to 5C are timing charts representing the clock signal CLK, the voltages $V_{g1}$ and $V_{g2}$, and the output voltages $V_{o1}$ and $V_{o2}$ in the case of $V_{i1} > V_{i2}$. The differential latch circuit portion 30 determines the output voltages $V_{o1}$ and $V_{o2}$ in accordance with the difference between the magnitudes of the voltages $V_{g1}$ and $V_{g2}$.

In the double-tail latch-type comparator 1 disclosed in Bram Nuata et al., "A Double-Tail Latch-Type Voltage Sense Amplifier with 18 ps Setup+Hold Time", IEEE International Solid-State Circuits Conference 2007, Session 17, Analog Techniques and PLLs, 17.7, an appropriate delay time between the first clock signal CLK1 and the second clock signal CLK2 is needed. If the delay time is not appropriately set, a through-current flowing through the comparator 1 increases. The voltages $V_{out1}$ and $V_{out2}$ output as the result of the comparison between the input voltages $V_{in1}$ and $V_{in2}$ are reset with the falling edge timing of the second clock signal CLK2. In the case where the comparator 1 is connected to a logic circuit that operates with the falling edge timing of the second clock signal CLK2, a half latch circuit is therefore further needed at a stage subsequent to the comparator 1.

In the comparator 4 disclosed in U.S. Pat. No. 8,487,659, an appropriate delay time between the first clock signal CLK1 and the second clock signal CLK2 is also needed. The delay circuit 7 is therefore needed for this delay time. In the case where the comparator 4 is connected to a logic circuit that operates with the falling edge timing of the second clock signal CLK2, a half latch circuit is also further needed at a stage subsequent to the comparator 4.

In the comparator 10 disclosed in U.S. Pat. No. 8,362,934, the differential latch circuit portion 30 performs latch processing using the voltages $V_{g1}$ and $V_{g2}$ output from the differential preamplifier circuit portion 20. Since only the single clock signal CLK is used in the comparator 10 in the related art, there is no need to set an appropriate delay time between two clock signals CLK1 and CLK2, similar to the comparator 1 disclosed in Bram Nuata et al., "A Double-Tail Latch-Type Voltage Sense Amplifier with 18 ps Setup+Hold Time", IEEE International Solid-State Circuits Conference 2007, Session 17, Analog Techniques and PLLs, 17.7 and the comparator 4 disclosed in U.S. Pat. No. 8,487,659. However, in the case where the comparator 10 is connected to a logic circuit that operates with the rising or falling edge timing of the clock signal CLK, a half latch circuit is also further needed.

SUMMARY OF THE INVENTION

Preferred embodiments of the present invention provide comparison circuits which each include a preliminary amplification circuit that amplifies a voltage difference between a first input voltage and a second input voltage and a latch circuit that compares magnitudes of the first input voltage and the second input voltage according to the amplified voltage difference and latch a comparison result.

The preliminary amplification circuit converts the first input voltage and the second input voltage into a first control signal and a second control signal, respectively, that exhibit reversals with specific change timing of a clock signal and returns at speeds corresponding to respective magnitudes of the input first input voltage and the input second input voltage.

The latch circuit compares magnitudes of the first input voltage and the second input voltage according to the first control signal and the second control signal.

Accordingly, the preliminary amplification circuit generates the first control signal and the second control signal with the specific change timing of the clock signal. The latch circuit compares the first input voltage and the second input voltage according to the first control signal and the second control signal and latches a result of the comparison. The first control signal and the second control signal generated by the preliminary amplification circuit return from the reversal state at respective speeds corresponding to the first input voltage and the second input voltage to cause the latch circuit to latch in a state based on the result of the comparison between the magnitudes of the first input voltage and the second input voltage.

After latching the result of the comparison between the magnitudes of the first input voltage and the second input voltage with the specific change timing of the clock signal, the latch circuit maintains the latch state until the next new first and second control signals are input with the next specific change timing of the clock signal. Therefore, the result of the comparison between the magnitudes of the first input voltage and the second input voltage does not change with timing other than the specific change timing of the clock signal. As a result, the comparison result can be output to a logic circuit that operates in response to the same or substantially the same clock signal as the comparison circuit at a stage subsequent to the comparison circuit without providing a half latch circuit at the subsequent stage.

Since the latch circuit operates in response to the first control signal and the second control signal output from the preliminary amplification circuit, only one type of clock signal supplied to the preliminary amplification circuit is needed. Accordingly, there is no need to set an appropriate delay time between a first clock signal supplied to a preliminary amplification circuit and a second clock signal supplied to a latch circuit, similar to a comparison circuit in the related art, to sequentially operate the preliminary amplification circuit and the latch circuit with appropriate timings. A problem in the related art in which a through-current increases because of the inappropriate setting of a delay time between clock signals therefore does not arise. The lower power consumption of the comparison circuit can be achieved.

In a preferred embodiment of the present invention, the preliminary amplification circuit includes a first transistor, a second transistor, a first capacitor, and a second capacitor, respective source terminals of the first transistor and the second transistor are connected to one of a power supply voltage and a reference voltage, a drain terminal of the first transistor and one terminal of the first capacitor are connected to a first control signal terminal from which the first control signal is output to the latch circuit, a drain terminal of the second transistor and one terminal of the second capacitor are connected to a second control signal terminal from which the second control signal is output to the latch circuit, and the clock signal is supplied to the other terminal of the first capacitor and the other terminal of the second capacitor.

Accordingly, with the specific change timing of the clock signal, the first control signal that returns from the reversal state at a speed corresponding to the magnitude of the first input voltage appears at the first control signal terminal. The second control signal that returns from the reversal state at a speed corresponding to the magnitude of the second input voltage appears at the second control signal terminal. Accordingly, the voltage difference between the first control signal and the second control signal is a resultant obtained by causing a small number of elements to amplify the difference between the first input voltage and the second input voltage. The latch circuit receives the input of this voltage difference, compares the first input voltage and the second input voltage, and latches a result of the comparison.

In a preferred embodiment of the present invention, a third transistor including a gate terminal to which the clock signal is supplied is connected to a node between the first transistor and the second transistor.

Accordingly, the third transistor simultaneously operates when the first transistor and the second transistor operate with the specific change timing of the clock signal. At that time, voltages applied to the respective source terminals of the first transistor and the second transistor decrease because of the on-resistance of the third transistor. The peak values of a current flowing through the first transistor in accordance with the first input voltage and a current flowing through the second transistor in accordance with the second input voltage are therefore significantly reduced. Accordingly, the power consumption of the comparison circuit can be reduced.

In a preferred embodiment of the present invention, the latch circuit includes fourth to ninth transistors that each have a channel polarity that is a first polarity, the latch circuit includes tenth to thirteenth transistors that each have a channel polarity that is a second polarity, the respective source terminals of the fourth to ninth transistors are connected to one of the power supply voltage and the reference voltage, respective source terminals of the twelfth and thirteenth transistors are connected to the other one of the power supply voltage and the reference voltage, respective drain terminals of the fourth, sixth, and tenth transistors are connected to a first output terminal, respective drain terminals of the fifth, seventh, eleventh transistors are connected to a second output terminal, a source terminal of the tenth transistor and respective drain terminals of the eighth and twelfth transistors are interconnected to each other, a source terminal of the eleventh transistor and respective drain terminals of the ninth and thirteenth transistors are interconnected to each other, the first control signal terminal is connected to respective gates of the fourth, eighth, and twelfth transistors, and the second control signal terminal is connected to respective gates of the fifth, ninth, and thirteenth transistors.

Accordingly, the latch circuit includes a small number of elements, the fourth to ninth transistors whose channel polarities are a first polarity and the tenth to thirteenth transistors whose channel polarities are a second polarity.

In a preferred embodiment of the present invention, the comparison circuit further includes a fourteenth transistor including a gate terminal to which the first control signal terminal is connected, a drain terminal connected to the second output terminal, and a source terminal connected to respective source terminals of the fourth to seventh transistors, and a fifteenth transistor including a gate terminal to which the second control signal terminal is connected, a drain terminal connected to the first output terminal, and a source terminal connected to the respective source terminals of the fourth to seventh transistors.

The first control signal and the second control signal are input from the preliminary amplification circuit to the latch circuit with the specific change timing of the clock signal, so that the latch circuit is reset. After that, the kickback of an electric charge corresponding to the first output voltage output from the first output terminal and the kickback of an electric charge corresponding to the second output voltage output from the second output terminal are transmitted to the fourth transistor and the fifth transistor, respectively. The difference between the kickback of the electric charge transmitted to the fourth transistor and the kickback of the electric charge transmitted to the fifth transistor affects the following amplification operation of the preliminary amplification circuit. That is, the comparison between the first input voltage and the second input voltage performed by the comparison circuit may be affected by a result of the comparison performed with the last specific change timing of the clock signal.

However, since a voltage based on the result of the last comparison is applied from the second output terminal to the drain terminal of the fourteenth transistor, an electric charge based on the result of the last comparison output from the second output terminal exerts an effect upon the first control signal terminal that is subject to the influence of an electric charge based on a result of the last comparison output from the first output terminal from the fourth transistor. Since a voltage based on a result of the last comparison is applied from the first output terminal to the drain terminal of the fifteenth transistor, an electric charge based on the result of the last comparison output from the first output terminal exerts an effect upon the second control signal terminal that is subject to the influence of an electric charge based on a result of the last comparison output from the second output terminal from the fifth transistor. Accordingly, each of the first control signal terminal and the second control signal terminal is subject to the influences of the results of the last comparison output from the first output terminal and the second output terminal.

The voltages output from the first output terminal and the second output terminal as the results of the last comparison are opposite in voltage level. The effects of the results of the last comparison upon the first control signal terminal and the second control signal terminal are substantially the same and cancel each other. Accordingly, the first control signal and the second control signal output from the preliminary amplification circuit to the latch circuit with the next specific change timing of the clock signal reflect the relative reduction in the last comparison result. The comparison between voltages performed by the comparison circuit is therefore less susceptible to the last comparison result. The effect of the last comparison result is reduced.

Preferred embodiments of the present invention provide comparison circuits with each of which a comparison result can be output without providing a half latch circuit in a logic circuit that operates with the same or substantially the same clock signal as the comparison circuit at a stage subsequent to the comparison circuit and lower power consumption can be achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a circuit diagram of a first comparison circuit in the related art.

FIGS. 2A to 2C are timing charts representing voltage waveforms in respective portions in the first comparison circuit in the related art.

FIGS. 5A to 5C are timing charts representing voltage waveforms in respective portions in the third comparison circuit in the related art.

FIG. 6 is a circuit diagram of a comparison circuit according to a first preferred embodiment of the present invention.

FIG. 7A is a timing chart representing a clock signal in the comparison circuit according to the first preferred embodiment of the present invention, FIG. 7B is a timing chart representing a voltage $V_x$ at a node x and a voltage $V_y$ at a node y, and FIG. 7C is a timing chart representing the voltage waveform of a voltage $V_{out1}$ at an output terminal out1 and the voltage waveform of a voltage $V_{out2}$ at an output terminal out2.

FIG. 8 is a circuit diagram of a comparison circuit that is a modification of the first preferred embodiment of the present invention.

FIG. 9A is a timing chart representing a clock signal in the comparison circuit that is the modification of the first preferred embodiment of the present invention, FIG. 9B is a timing chart representing a voltage $V_x$ at a node x and a voltage $V_y$ at a node y, and FIG. 9C is a timing chart representing the voltage waveform of a voltage $V_{out1}$ at an output terminal out1 and the voltage waveform of a voltage $V_{out2}$ at an output terminal out2.

FIG. 10 is a circuit diagram of a comparison circuit according to a second preferred embodiment of the present invention.

FIG. 12 is a circuit diagram of a comparison circuit according to a third preferred embodiment of the present invention.

FIG. 13A is a timing chart representing a clock signal in the comparison circuit according to the third preferred embodiment of the present invention, FIG. 13B is a timing chart representing a voltage $V_x$ at a node x, a voltage $V_y$ at a node y, and a voltage VB at a node B, and FIG. 13C is a timing chart representing the voltage waveform of a voltage $V_{out1}$ at an output terminal out1 and the voltage waveform of a voltage $V_{out2}$ at an output terminal out2.

FIG. 14 is a circuit diagram of a comparison circuit that is a modification of the third preferred embodiment of the present invention.

FIG. 15A is a timing chart representing a clock signal in the comparison circuit that is a modification of the third preferred embodiment of the present invention, FIG. 15B is a timing chart representing a voltage $V_x$ at a node x, a voltage $V_y$ at a node y, and a voltage VB at a node B, and FIG. 15C is a timing chart representing the voltage waveform of a voltage $V_{out1}$ at an output terminal out1 and the voltage waveform of a voltage $V_{out2}$ at an output terminal out2.

DETAILED DESCRIPTION OF THE PREFERRED EMBODIMENTS

Figure 3:
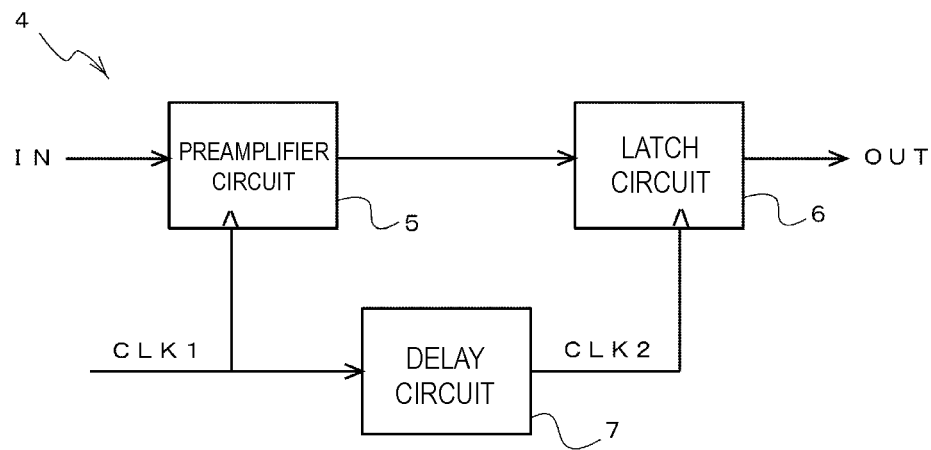
FIG. 3 is a circuit diagram of a second comparison circuit in the related art.
Figure 4:
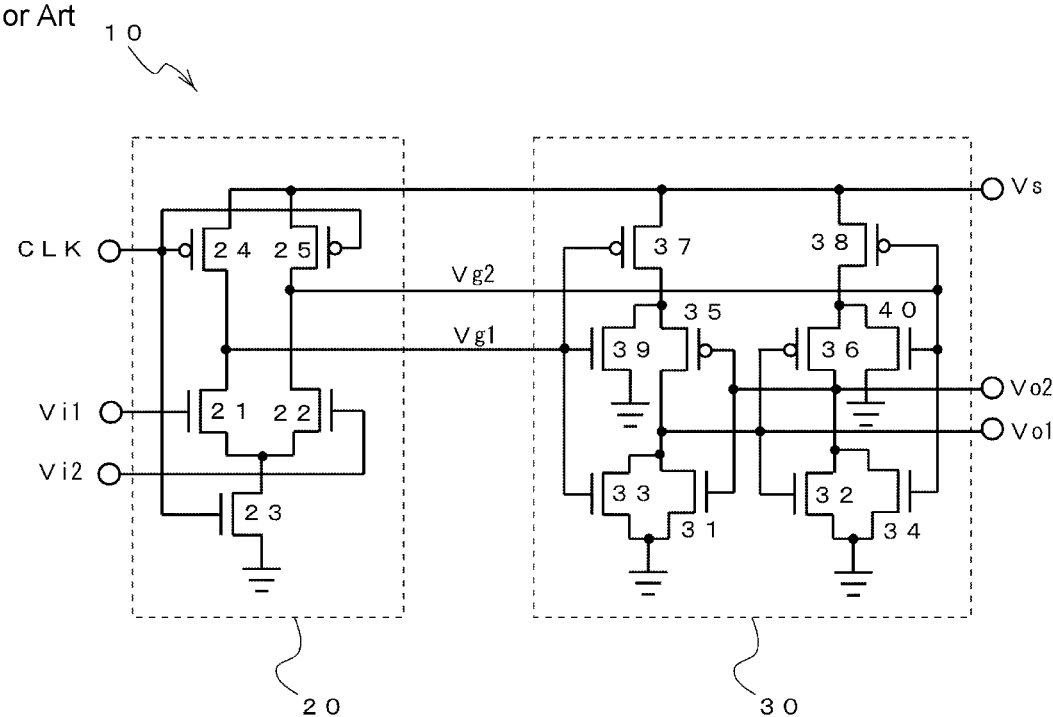
FIG. 4 is a circuit diagram of a third comparison circuit in the related art.

Preferred embodiments of the present invention will be described in detail below with reference to the drawings.

A comparison circuit according to a first preferred embodiment of the present invention will be described below.

FIG. 6 is a circuit diagram of a comparison circuit 41A according to a first preferred embodiment of the present invention.

The comparison circuit 41A includes a preliminary amplification circuit 42A that dynamically amplifies a voltage difference between a first input voltage $V_{in1}$ input into a first input terminal in1 and a second input voltage $V_{in2}$ input into a second input terminal in2 and a latch circuit 43A that compares the magnitudes of the first input voltage $V_{in1}$ and the second input voltage $V_{in2}$ according to the amplified voltage difference and latches a result of the comparison.

The preliminary amplification circuit 42A converts the first input voltage $V_{in1}$ and the second input voltage $V_{in2}$ which are input with the specific change timing of a clock signal CLK shown in FIG. 7A, the falling edge timing of the clock signal CLK in the first preferred embodiment, into a first control signal $V_x$ and a second control signal $V_y$ shown in FIG. 7B, respectively. These drawings show signal waveforms obtained in the case where the first input voltage $V_{in1}$ is higher than the second input voltage $V_{in2}$ ($V_{in1}$>$V_{in2}$). The first control signal $V_x$ appears at a node x corresponding to a first control signal terminal. The second control signal $V_y$ appears at a node y corresponding to a second control signal terminal. The first control signal $V_x$ and the second control signal $V_y$ have waveforms that exhibit reversals to the low-level side with the falling edge timing of the clock signal CLK and returns to the high-level side at speeds corresponding to the magnitudes of the first input voltage $V_{in1}$ and the second input voltage $V_{in2}$. The latch circuit 43A compares the first input voltage $V_{in1}$ and the second input voltage $V_{in2}$ with each other according to the first control signal $V_x$ and the second control signal $V_y$. FIG. 7C shows a result of the comparison. As the result of the comparison, a first output voltage $V_{out1}$ is output to a first output terminal out1 and a second output voltage $V_{out2}$ is output to a second output terminal out2.

In the first preferred embodiment, the preliminary amplification circuit 42A includes a first transistor M1, a second transistor M2, a first capacitor $C_{D1}$, and a second capacitor $C_{D2}$. The respective source terminals of the first transistor M1 and the second transistor M2 are connected to a power supply voltage $V_{DD}$. The drain terminal of the first transistor M1 and one terminal of the first capacitor $C_{D1}$ are connected to the node x from which the first control signal $V_x$ is output to the latch circuit 43A. The drain terminal of the second transistor M2 and one terminal of the second capacitor $C_{D2}$ are connected to the node y from which the second control signal $V_y$ is output to the latch circuit 43A. The clock signal CLK is supplied to the other terminals of the first capacitor $C_{D1}$ and the second capacitor $C_{D2}$. The first transistor M1 and the second transistor M2 in the preliminary amplification circuit 42A are formed of PMOS transistors. The first input voltage $V_{in1}$ and the second input voltage $V_{in2}$ are applied to the gates of the PMOS transistors, respectively.

The latch circuit 43A includes a fourth transistor M4 to a ninth transistor M9 having a first channel polarity and a tenth transistor M10 to a thirteenth transistor M13 having a second channel polarity. In the latch circuit 43A, the fourth transistor M4 to the ninth transistor M9 are preferably, for example, PMOS transistors having a P channel polarity and the tenth transistor M10 to the thirteenth transistor M13 are preferably, for example, NMOS transistors having an N channel polarity. The components excluding the eighth transistor M8 and the ninth transistor M9, that is, the fourth transistor M4 to the seventh transistor M7 and the tenth transistor M10 to the thirteenth transistor M13 define an RS flip-flop.

The respective source terminals of the fourth transistor M4 to the ninth transistor M9 are connected to the power supply voltage $V_{DD}$. The respective source terminals of the twelfth transistor M12 and the thirteenth transistor M13 are connected to a reference voltage $V_{SS}$. The respective drain terminals of the fourth transistor M4, the sixth transistor M6, and the tenth transistor M10 are connected to the first output terminal out1. The respective drain terminals of the fifth transistor M5, the seventh transistor M7, and the eleventh transistor M11 are connected to the second output terminal out2. The source terminal of the tenth transistor M10 and the respective drain terminals of the eighth transistor M8 and the twelfth transistor M12 are interconnected to each other. The source terminal of the eleventh transistor M11 and the respective drain terminals of the ninth transistor M9 and the thirteenth transistor M13 are interconnected to each other. The node x is connected to the respective gates of the fourth transistor M4, the eighth transistor M8, and the twelfth transistor M12. The node y is connected to the respective gates of the fifth transistor M5, the ninth transistor M9, and the thirteenth transistor M13.

With the falling edge timing of the clock signal CLK, the first control signal $V_x$ that returns from the reversal state at a speed corresponding to the magnitude of the first input voltage $V_{in1}$ appears at the node x between the first transistor M1 and the first capacitor $C_{D1}$. The second control signal $V_y$ that returns from the reversal state at a speed corresponding to the magnitude of the second input voltage $V_{in2}$ appears at the node y between the second transistor M2 and the second capacitor $C_{D2}$. Accordingly, the voltage difference between the first control signal $V_x$ and the second control signal $V_y$ is a resultant obtained by causing a small number of elements to amplify the difference between the first input voltage $V_{in1}$ and the second input voltage $V_{in2}$.

That is, with the falling edge timing of the clock signal CLK, the voltages at the nodes x and y exhibit reversals to decrease as shown in FIG. 7B. Subsequently, since the gate potential of the first transistor M1 is higher than the gate potential of the second transistor M2 when the first input voltage $V_{in1}$ is higher than the second input voltage $V_{in2}$, the current flowing between the source and drain of the first transistor M1 is smaller than the current flowing between the source and drain of the second transistor M2. The first capacitor $C_{D1}$ is therefore charged with a smaller current than the second capacitor $C_{D2}$. The voltage of the first control signal $V_x$ that appears at the node x is lower than the voltage of the second control signal $V_y$ that appears at the node y as shown in FIG. 7B.

Before the clock signal CLK falls, the voltages at the nodes x and y are at the high level and the first output voltage $V_{out1}$ and the second output voltage $V_{out2}$ are the result of the last comparison. However, when the voltages at the nodes x and y are brought into the low level with the falling edge timing of the clock signal CLK, the fourth transistor M4 and the fifth transistor M5 are turned on and the twelfth transistor M12 and the thirteenth transistor M13 are turned off in the latch circuit 43A. Accordingly, a node N1 (that is, the first output voltage $V_{out1}$) and a node N2 (that is, the second output voltage $V_{out2}$) are brought into the high level, so that the latch circuit 43A is reset. At that time, the ON operations of the eighth transistor M8 and the ninth transistor M9 make the drain voltages of the twelfth transistor M12 and the thirteenth transistor M13 high, respectively to fix the potentials of them.

Subsequently, the first capacitor $C_{D1}$ and the second capacitor $C_{D2}$ are charged with impedances depending on the first input voltage $V_{in1}$ and the second input voltage $V_{in2}$, respectively, so that a voltage $V_y$ at the node y is higher than a voltage $V_x$ at the node x. Accordingly, the thirteenth transistor M13 approaches the conduction state faster than the twelfth transistor M12 and the fifth transistor M5 approaches the non-conduction state faster than the fourth transistor M4. The voltage at the node N2 approaches the low level faster than the voltage at the node N1. This situation is subjected to positive feedback by the sixth transistor M6, the tenth transistor M10, the seventh transistor M7, and the eleventh transistor M11. As a result, as shown in FIG. 7C, the node N1 (that is, the first output voltage $V_{out1}$ is stably held at the high level and the node N2 (that is, the second output voltage $V_{out2}$) is stably held at the low level. This state is latched by the latch circuit 43A.

The sequence of these operations is performed only with the falling edge timing of the clock signal CLK and is not performed with the rising edge timing of the clock signal CLK. Similar operations are performed with the next falling edge timing of the clock signal CLK. When there is no change in the magnitude relationship between the first input voltage $V_{in1}$ and the second input voltage $V_{in2}$, the levels of the first output voltage $V_{out1}$ and the second output voltage $V_{out2}$ are maintained with the rising edge timing of the clock signal CLK as shown in FIG. 7C.

In the comparison circuit 41A according to the first preferred embodiment, the preliminary amplification circuit 42A generates the first control signal $V_x$ and the second control signal $V_y$ with the falling edge timing of the clock signal CLK. The latch circuit 43A compares the first input voltage $V_{in1}$ and the second input voltage $V_{in2}$ with each other according to the first control signal $V_x$ and the second control signal $V_y$ and latches a result of the comparison. The first control signal $V_x$ and the second control signal $V_y$ generated by the preliminary amplification circuit 42A return from the reversal state at speeds corresponding to the first input voltage $V_{in1}$ and the second input voltage $V_{in2}$, respectively, so that the latch circuit 43A is latched in a state based on the result of the comparison between the first input voltage $V_{in1}$ and the second input voltage $V_{in2}$.

After the latch circuit 43A has latched the result of the comparison between the magnitudes of the first input voltage $V_{in1}$ and the second input voltage $V_{in2}$ with the falling edge timing of the clock signal CLK, the latch circuit 43A holds this latch state until the new first control signal $V_x$ and the new second control signal $V_y$ are input with the next falling edge timing of the clock signal CLK. The result of the comparison between the first input voltage $V_{in1}$ and the second input voltage $V_{in2}$ which is output from the latch circuit 43A therefore does not change with the rising edge timing of the clock signal CLK. As a result, the comparison circuit 41A can be connected to a logic circuit that operates in response to the same or substantially the same clock signal as the comparison circuit without a half latch circuit at a stage subsequent to the comparison circuit which is needed in the related art.

Since the latch circuit 43A operates in response to the first control signal $V_x$ and the second control signal $V_y$ output from the preliminary amplification circuit 42A, only one type of the clock signal CLK supplied to the preliminary amplification circuit 42A is needed. Accordingly, there is no need to set an appropriate delay time between a first clock signal supplied to a preliminary amplification circuit and a second clock signal supplied to a latch circuit, similar to a comparison circuit in the related art, to sequentially operate the preliminary amplification circuit 42A and the latch circuit 43A with appropriate timings. A problem in the related art in which a through-current increases because of the inappropriate setting of a delay time between clock signals therefore does not arise. Since an excessive through-current does not flow, the power consumption of the comparison circuit 41A can be reduced.

In the comparison circuit 41A according to the first preferred embodiment, the latch circuit 43A includes a small number of elements, the fourth transistor M4 to the ninth transistor M9 that are PMOS transistors and the tenth transistor M10 to the thirteenth transistor M13 that are NMOS transistors.

FIG. 8 is a circuit diagram of a comparison circuit 41B that is a modification of the comparison circuit 41A according to the first preferred embodiment. FIGS. 9A to 9C are timing charts representing voltage changes in respective portions in the comparison circuit 41B shown in FIG. 8. In FIGS. 8 and 9, the same reference numerals are used to identify portions already described with reference to FIGS. 6 and 7 or equivalent portions, and the description thereof will be omitted.

The comparison circuit 41B according to the present modification differs from the comparison circuit 41A according to the first preferred embodiment in the channel polarities of the first transistor M1, the second transistor M2, and the fourth transistor M4 to the thirteenth transistor M13 and the directions of application of the power supply voltage $V_{DD}$ and the reference voltage $V_{SS}$. In addition, the comparison circuit 41B differs from the comparison circuit 41A according to the first preferred embodiment in that the specific change timing of the clock signal CLK is rising edge timing. The remaining configuration of the comparison circuit 41B is the same as, or similar to, the comparison circuit 41A according to the first preferred embodiment.

In the comparison circuit 41A according to the first preferred embodiment, the first transistor M1 and the second transistor M2 in the preliminary amplification circuit 42A are PMOS transistors, the fourth transistor M4 to the ninth transistor M9 in the latch circuit 43A are PMOS transistors, and the tenth transistor M10 to the thirteenth transistor M13 in the latch circuit 43A are NMOS transistors. In the comparison circuit 41B according to the present modification, the first transistor M1 and the second transistor M2 in a preliminary amplification circuit 42B are preferably NMOS transistors, the fourth transistor M4 to the ninth transistor M9 in a latch circuit 43B are preferably NMOS transistors, and the tenth transistor M10 to the thirteenth transistor M13 in the latch circuit 43B are preferably PMOS transistors. The power supply voltage $V_{DD}$ in the comparison circuit 41A according to the first preferred embodiment is replaced by the reference voltage $V_{SS}$ in the comparison circuit 41B according to the present modification and the reference voltage $V_{SS}$ in the comparison circuit 41A according to the first preferred embodiment is replaced by the power supply voltage $V_{DD}$ in the comparison circuit 41B according to the present modification. With the rising edge timing of the clock signal CLK, the output of the latch circuit 43B is reset to the low level.

In the comparison circuit 41B, the first control signal $V_x$ and the second control signal $V_y$ have waveforms that exhibit returns from the reversal state at speeds corresponding to the first input voltage $V_{in1}$ and the second input voltage $V_{in2}$ input with the rising edge timing of the clock signal CLK as shown in FIGS. 9(a) and 9(b). The voltages at the nodes x and y exhibit reversals to increase with the rising edge timing of the clock signal CLK. Subsequently, since the gate potential of the first transistor M1 is higher than the gate potential of the second transistor M2 when the first input voltage $V_{in1}$ is higher than the second input voltage $V_{in1}$, the current flowing between the drain and source of the first transistor M1 is larger than the current flowing between the drain and source of the second transistor M2. The amount of discharge of the first capacitor $C_{D1}$ is therefore larger than that of the second capacitor $C_{D2}$. The voltage of the first control signal $V_x$ that appears at the node x is lower than the voltage of the second control signal $V_y$ that appears at the node y as shown in FIG. 9B.

Before the clock signal CLK rises, the voltages at the nodes x and y are at the low level and the first output voltage $V_{out1}$ and the second output voltage $V_{out2}$ are the result of the last comparison. However, when the voltages at the nodes x and y are brought into the high level with the rising edge timing of the clock signal CLK, the fourth transistor M4 and the fifth transistor M5 are turned on and the twelfth transistor M12 and the thirteenth transistor M13 are turned off in the latch circuit 43B. Accordingly, the node N1 (that is, the first output voltage $V_{out1}$) and the node N2 (that is, the second output voltage $V_{out2}$) are brought into the low level, so that the latch circuit 43B is reset. At that time, the ON operations of the eighth transistor M8 and the ninth transistor M9 make the drain voltages of the twelfth transistor M12 and the thirteenth transistor M13 low, respectively to fix the potentials thereof.

Subsequently, the first capacitor $C_{D1}$ and the second capacitor $C_{D2}$ are discharged with impedances depending on the first input voltage $V_{in1}$ and the second input voltage $V_{in2}$, respectively, so that the voltage $V_y$ at the node y is higher than the voltage $V_x$ at the node x. Accordingly, the thirteenth transistor M13 approaches the non-conduction state faster than the twelfth transistor M12 and the fifth transistor M5 approaches the conduction state faster than the fourth transistor M4. The voltage at the node N2 approaches the low level faster than the voltage at the node N1. This situation is subjected to positive feedback by the sixth transistor M6, the tenth transistor M10, the seventh transistor M7, and the eleventh transistor M11. As a result, as shown in FIG. 9C, the node N1 (that is, the first output voltage $V_{out1}$) is stably held at the high level and the node N2 (that is, the second output voltage $V_{out2}$) is stably held at the low level. This state is latched by the latch circuit 43B.

The sequence of these operations is performed only with the rising edge timing of the clock signal CLK and is not performed with the falling edge timing of the clock signal CLK. Similar operations are performed with the next rising edge timing of the clock signal CLK. When there is no change in the magnitude relationship between the first input voltage $V_{in1}$ and the second input voltage $V_{in2}$, the levels of the first output voltage $V_{out1}$ and the second output voltage $V_{out2}$ are maintained with the falling edge timing of the clock signal CLK as shown in FIG. 9C.

With the comparison circuit 41B according to the present modification, an operational effect similar to that obtained with the comparison circuit 41A according to the first preferred embodiment can be obtained.

FIG. 10 is a circuit diagram of a comparison circuit 51A according to a second preferred embodiment of the present invention. In FIG. 10, the same reference numerals are used to identify portions already described with reference to FIG. 6 or equivalent portions, and the description thereof will be omitted.

The comparison circuit 51A differs from the comparison circuit 41A according to the first preferred embodiment only in that a latch circuit 53A includes a fourteenth transistor M14 and a fifteenth transistor M15. The remaining configuration of the comparison circuit 51A is the same as, or similar to, the comparison circuit 41A according to the first preferred embodiment.

The fourteenth transistor M14 includes a gate terminal to which the node x is connected, a drain terminal to which the second output terminal out2 is connected, and a source terminal to which the respective source terminals of the fourth transistor M4 to the seventh transistor M7 are connected. The fifteenth transistor M15 includes a gate terminal to which the node y is connected, a drain terminal to which the first output terminal out1 is connected, and a source terminal to which the respective source terminals of the fourth transistor M4 to the seventh transistor M7 are connected.

In the comparison circuit 41A according to the first preferred embodiment, the first control signal $V_x$ and the second control signal $V_y$ are input from the preliminary amplification circuit 42A to the latch circuit 43A with the falling edge timing of the clock signal CLK, so that the latch circuit 43A is reset. After that, the kickback of an electric charge corresponding to the first output voltage $V_{out1}$ and the kickback of an electric charge corresponding to the second output voltage $V_{out2}$ are transmitted to the fourth transistor M4 and the fifth transistor M5, respectively. The difference between the kickback of the electric charge transmitted to the fourth transistor M4 and the kickback of the electric charge transmitted to the fifth transistor M5 affects the following amplification operation of the preliminary amplification circuit 42A. That is, the comparison between the first input voltage $V_{in1}$ and the second input voltage $V_{in2}$ performed by the comparison circuit 41A may be affected by a result of the comparison performed with the last falling edge timing of the clock signal CLK.

However, in the comparison circuit 51A according to the second preferred embodiment, since a voltage based on a result of the last comparison is applied from the second output terminal out2 to the drain terminal of the fourteenth transistor M14, an electric charge based on the result of the last comparison output from the second output terminal out2 exerts an effect upon the node x that is subject to the influence of an electric charge based on a result of the last comparison output from the first output terminal out1 from the fourth transistor M4. Since a voltage based on a result of the last comparison is applied from the first output terminal out1 to the drain terminal of the fifteenth transistor M15, an electric charge based on the result of the last comparison output from the first output terminal out1 exerts an effect upon the node y that is subject to the influence of an electric charge based on a result of the last comparison output from the second output terminal out2 from the fifth transistor M5.

Accordingly, each of the nodes x and y is subject to the influences of the results of the last comparison output from the first output terminal out1 and the second output terminal out2.

The voltages output from the first output terminal out1 and the second output terminal out2 as the results of the last comparison are opposite in voltage level. The effects of the results of the last comparison upon the nodes x and y are the same or substantially the same and cancel each other. Accordingly, the first control signal $V_x$ and the second control signal $V_y$ output from the preliminary amplification circuit 42A to the latch circuit 53A with the next falling edge timing of the clock signal CLK reflect the relative reduction in the last comparison result. The comparison between voltages performed by the comparison circuit 51A is therefore less susceptible to the last comparison result. The effect of the last comparison result is reduced.

Figure 11:
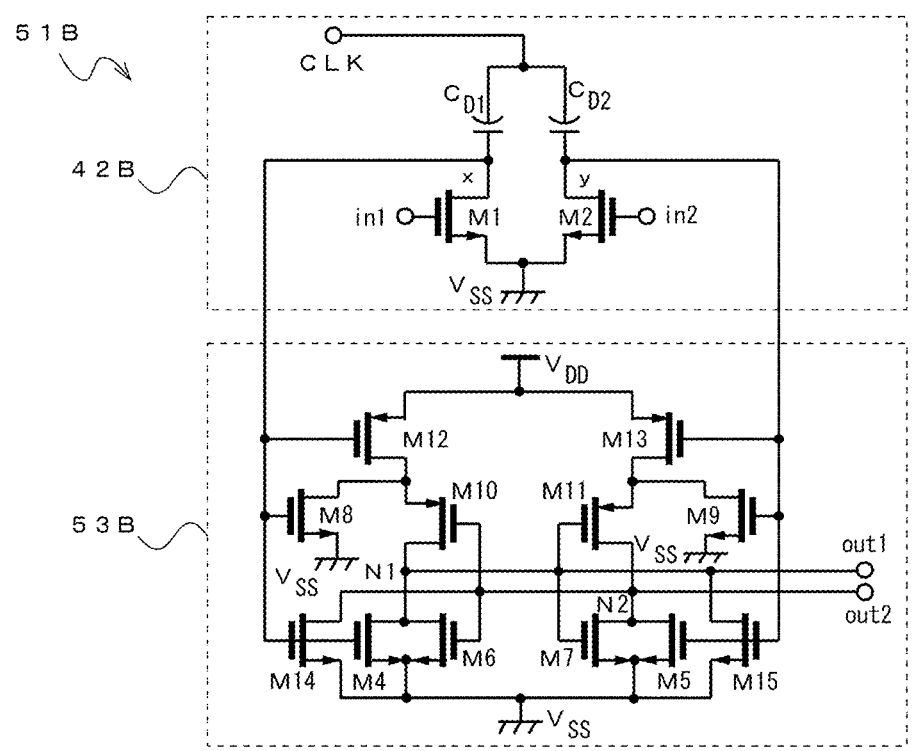
FIG. 11 is a circuit diagram of a comparison circuit that is a modification of the second preferred embodiment of the present invention.

FIG. 11 is a circuit diagram of a comparison circuit 51B that is a modification of the comparison circuit 51A according to the second preferred embodiment. In FIG. 11, the same reference numerals are used to identify portions already described with reference to FIGS. 8 and 10 or equivalent portions, and the description thereof will be omitted.

The comparison circuit 51B according to the present modification differs from the comparison circuit 51A according to the second preferred embodiment in the channel polarities of the first transistor M1, the second transistor M2, and the fourth transistor M4 to the fifteenth transistor M15 and the directions of application of the power supply voltage $V_{DD}$ and the reference voltage $V_{SS}$. In addition, the comparison circuit 51B differs from the comparison circuit 51A according to the second preferred embodiment in that the specific change timing of the clock signal CLK is the rising edge timing of the clock signal CLK. The remaining configuration of the comparison circuit 51B is the same as, or similar to, the comparison circuit 51A according to the second preferred embodiment.

In the comparison circuit 51A, the first transistor M1 and the second transistor M2 in the preliminary amplification circuit 42A are PMOS transistors, the fourth transistor M4 to the ninth transistor M9, the fourteenth transistor M14, and the fifteenth transistor M15 in the latch circuit 53A are PMOS transistors, and the tenth transistor M10 to the thirteenth transistor M13 in the latch circuit 53A are NMOS transistors. In the comparison circuit 51B according to the present modification, the first transistor M1 and the second transistor M2 in the preliminary amplification circuit 42B are preferably NMOS transistors, the fourth transistor M4 to the ninth transistor M9, the fourteenth transistor M14, and the fifteenth transistor M15 in the latch circuit 53B are preferably NMOS transistors, and the tenth transistor M10 to the thirteenth transistor M13 are preferably PMOS transistors. The power supply voltage $V_{DD}$ in the comparison circuit 51A according to the second preferred embodiment is replaced by the reference voltage $V_{SS}$ in the comparison circuit 51B according to the present modification. The reference voltage $V_{SS}$ in the comparison circuit 51A according to the second preferred embodiment is replaced by the power supply voltage $V_{DD}$ in the comparison circuit 51B that is this modification. With the rising edge timing of the clock signal CLK, the output of a latch circuit 53B is reset to the low level.

With the comparison circuit 51B according to the present modification, an operational effect similar to that obtained with the comparison circuit 51A according to the second preferred embodiment can be obtained.

FIG. 12 is a circuit diagram of a comparison circuit 61A according to a third preferred embodiment of the present invention. In FIG. 12, the same reference numerals are used to identify portions already described with reference to FIG. 6 or equivalent portions, and the description thereof will be omitted.

The comparison circuit 61A according to the third preferred embodiment differs from the comparison circuit 41A according to the first preferred embodiment only in that a preliminary amplification circuit 62A includes a third transistor M3. The remaining configuration of the comparison circuit 61A is the same as, or similar to, the comparison circuit 41A according to the first preferred embodiment. The third transistor M3 is connected to the node between the first transistor M1 and the second transistor M2. A clock signal is supplied to the gate terminal of the third transistor M3.

FIGS. 13A to 13C are timing charts representing voltage changes in respective portions in the comparison circuit 61A shown in FIG. 12. In FIGS. 13A to 13C, the same reference numerals are used to identify portions already described with reference to FIGS. 7A to 7C or equivalent portions, and the description thereof will be omitted.

In the comparison circuit 61A according to the third preferred embodiment, the third transistor M3 simultaneously operates when the first transistor M1 and the second transistor M2 operate with the falling edge timing of the clock signal CLK. At that time, the voltage at a node B at the drain of the third transistor M3 decreases because of the on-resistance of the third transistor M3 as shown in FIG. 13B. Voltages applied to the respective source terminals of the first transistor M1 and the second transistor M2 therefore decrease. The peak values of a current flowing through the first transistor M1 in accordance with the first input voltage $V_{in1}$ and a current instantaneously flowing through the second transistor M2 in accordance with the second input voltage $V_{in2}$ with the falling edge timing of the clock signal CLK are therefore significantly reduced. Accordingly, the power consumption of the comparison circuit 61A can be reduced.

FIG. 14 is a circuit diagram of a comparison circuit 61B that is a modification of the comparison circuit 61A according to the third preferred embodiment. FIGS. 15A to 15C are timing charts representing voltage changes in respective portions in the comparison circuit 61B shown in FIG. 14. In FIGS. 14 and 15, the same reference numerals are used to identify portions already described with reference to FIGS. 8, 12, and 13 or equivalent portions, and the description thereof will be omitted.

The comparison circuit 61B according to the present modification differs from the comparison circuit 61A according to the third preferred embodiment in the channel polarities of the first transistor M1 to the thirteenth transistor M13 and the directions of application of the power supply voltage $V_{DD}$ and the reference voltage $V_{SS}$. In addition, the comparison circuit 61B differs from the comparison circuit 61A according to the third preferred embodiment in that the specific change timing of the clock signal CLK is the rising edge timing of the clock signal CLK. The remaining configuration of the comparison circuit 61B is the same as, or similar to, the comparison circuit 61A according to the third preferred embodiment.

In the comparison circuit 61A according to the third preferred embodiment, the first transistor M1 to the third transistor M3 in the preliminary amplification circuit 62A are preferably PMOS transistors, the fourth transistor M4 to the ninth transistor M9 in the latch circuit 43A are preferably PMOS transistors, and the tenth transistor M10 to the thirteenth transistor M13 in the latch circuit 43A are preferably NMOS transistors. In the comparison circuit 61B according to the present modification, the first transistor M1 to the third transistor M3 in a preliminary amplification circuit 62B are preferably NMOS transistors, the fourth transistor M4 to the ninth transistor M9 in the latch circuit 43B are preferably NMOS transistors, the tenth transistor M10 to the thirteenth transistor M13 in the latch circuit 43B are preferably PMOS transistors. The power supply voltage $V_{DD}$ in the comparison circuit 61A according to the third preferred embodiment is replaced by the reference voltage $V_{SS}$ in the comparison circuit 61B according to the present modification. The reference voltage $V_{SS}$ in the comparison circuit 61A according to the third preferred embodiment is replaced by the power supply voltage $V_{DD}$ in the comparison circuit 61B according to the present modification. With the rising edge timing of the clock signal CLK, the output of the latch circuit 43B is reset to the low level.

In the comparison circuit 61B, the third transistor M3 simultaneously operates when the first transistor M1 and the second transistor M2 operate with the rising edge timing of the clock signal CLK. At that time, the voltage at the node B at the drain of the third transistor M3 increases because of the on-resistance of the third transistor M3 as shown in FIG. 15B. Voltages applied to the respective source terminals of the first transistor M1 and the second transistor M2 therefore decrease. The peak values of a current flowing through the first transistor M1 in accordance with the first input voltage $V_{in1}$ and a current instantaneously flowing through the second transistor M2 in accordance with the second input voltage $V_{in2}$ with the falling edge timing of the clock signal CLK are therefore significantly reduced. Accordingly, the power consumption of the comparison circuit 61B can be reduced. With the comparison circuit 61B that is a modification, an operational effect similar to that obtained with the comparison circuit 61A according to the third preferred embodiment can be obtained.

Figure 16:
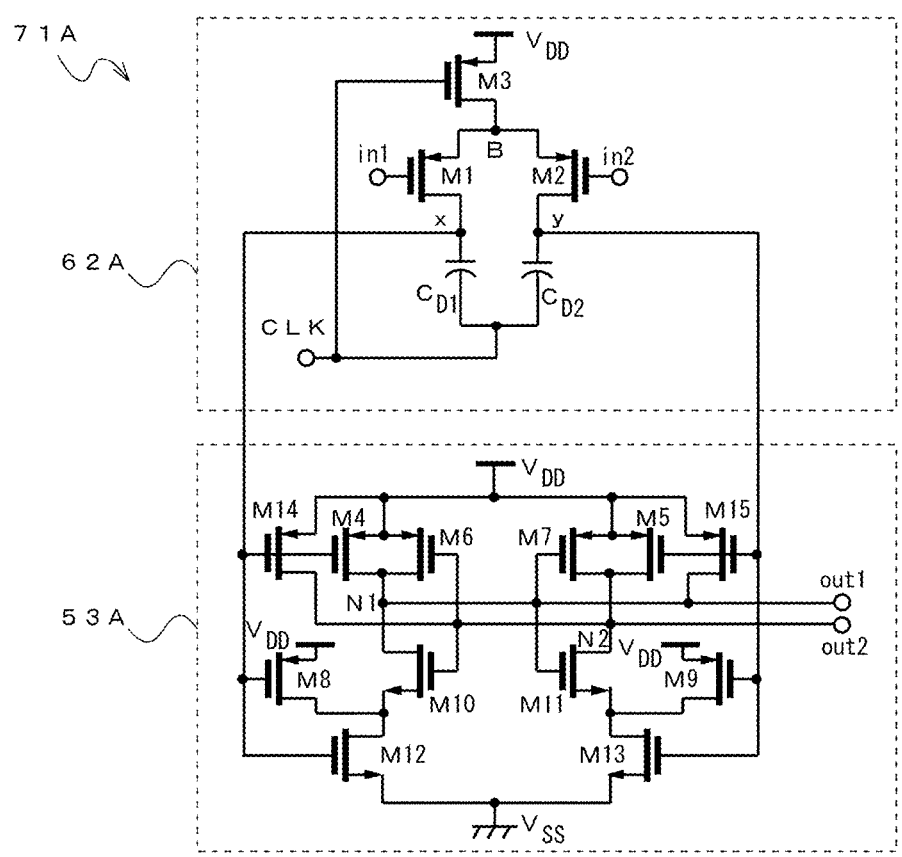
FIG. 16 is a circuit diagram of a comparison circuit according to a fourth preferred embodiment of the present invention.

FIG. 16 is a circuit diagram of a comparison circuit 71A according to a fourth preferred embodiment of the present invention. In FIG. 16, the same reference numerals are used to identify portions already described with reference to FIGS. 10 and 12 or equivalent portions, and the description thereof will be omitted.

The comparison circuit 71A according to the fourth preferred embodiment differs from the comparison circuit 51A according to the second preferred embodiment only in that the preliminary amplification circuit 62A includes the third transistor M3, similar to the comparison circuit 61A according to the third preferred embodiment. The remaining configuration of the comparison circuit 71A is the same as, or similar to, the comparison circuit 51A according to the second preferred embodiment.

With the comparison circuit 71A according to the fourth preferred embodiment in which the preliminary amplification circuit 62A includes the third transistor M3, an operational effect similar to that obtained with the comparison circuit 61A according to the third preferred embodiment can be obtained.

Figure 17:
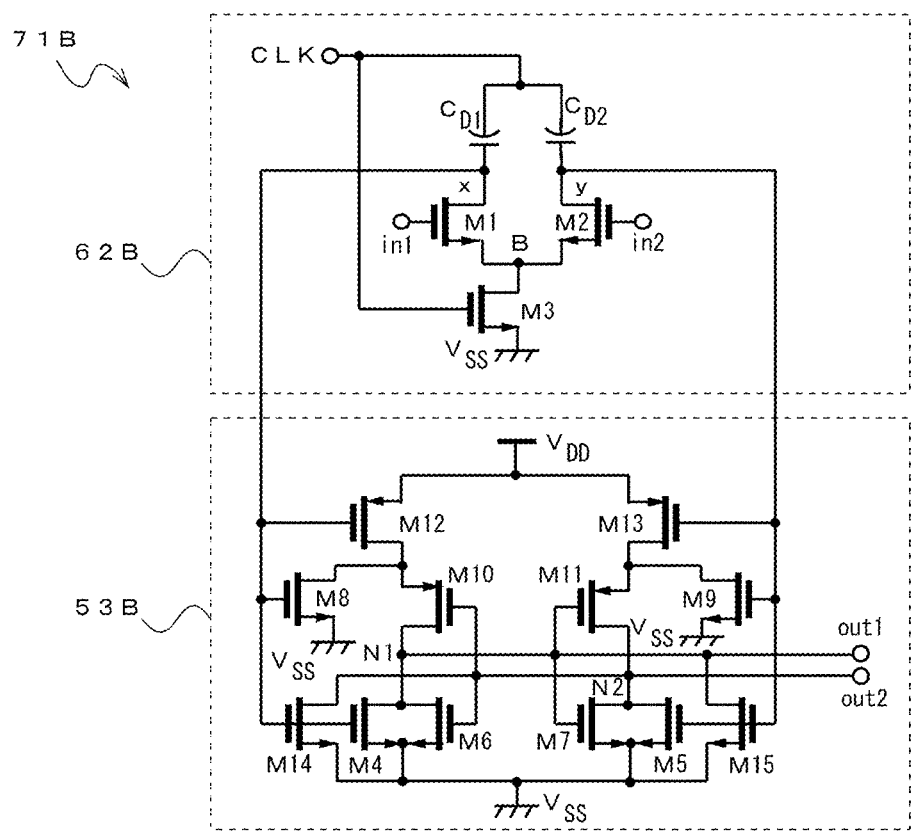
FIG. 17 is a circuit diagram of a comparison circuit that is a modification of the fourth preferred embodiment of the present invention.

FIG. 17 is a circuit diagram of a comparison circuit 71B that is a modification of the comparison circuit 71A according to the fourth preferred embodiment of the present invention. In FIG. 17, the same reference numerals are used to identify portions already described with reference to FIGS. 11 and 14 or equivalent portions, and the description thereof will be omitted.

The comparison circuit 71B according to the present modification differs from the comparison circuit 51B according to the modification of the second preferred embodiment only in that the preliminary amplification circuit 62B includes the third transistor M3, similar to the comparison circuit 61B according to the modification of the third preferred embodiment. Another implementation of the comparison circuit 71B is the same as, or similar to, the comparison circuit 51B that is a modification of the second preferred embodiment.

With the comparison circuit 71B according to the present modification in which the preliminary amplification circuit 62B includes the third transistor M3, an operational effect similar to that obtained with the comparison circuit 61A according to the third preferred embodiment can be obtained.

INDUSTRIAL APPLICABILITY

By using the comparison circuits 41A, 41B, 51A, 51B, 61A, 61B, 71A and 71B that are comparison circuits according to the respective preferred embodiments or the above-described modifications in comparators in A/D converters that convert an analog signal into a digital signal, they can contribute to the speedup and lower power consumption of entire systems of digital-analog mixed LSIs.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A comparison circuit comprising:
a preliminary amplification circuit that amplifies a voltage difference between a first input voltage and a second input voltage; and
a latch circuit that compares magnitudes of the first input voltage and the second input voltage according to the amplified voltage difference and latch a comparison result; wherein
the preliminary amplification circuit converts the first input voltage and the second input voltage into a first control signal and a second control signal, respectively, that exhibit reversals with specific change timing of a clock signal and returns at speeds corresponding to respective magnitudes of the first input voltage and the second input voltage; and
the latch circuit compares magnitudes of the first input voltage and the second input voltage according to the first control signal and the second control signal.
2. The comparison circuit according to claim 1, wherein the preliminary amplification circuit includes a first transistor, a second transistor, a first capacitor, and a second capacitor;
respective source terminals of the first transistor and the second transistor are connected to one of a power supply voltage and a reference voltage;
a drain terminal of the first transistor and one terminal of the first capacitor are connected to a first control signal terminal from which the first control signal is output to the latch circuit;
a drain terminal of the second transistor and one terminal of the second capacitor are connected to a second control signal terminal from which the second control signal is output to the latch circuit; and
the clock signal is supplied to another terminal of the first capacitor and another terminal of the second capacitor.

3. The comparison circuit according to claim 2, wherein a third transistor including a gate terminal to which the clock signal is supplied is connected to a node between the first transistor and the second transistor.

4. The comparison circuit according to claim 2, wherein
the latch circuit includes fourth to ninth transistors that each has a channel polarity that is a first polarity;
the latch circuit includes tenth to thirteenth transistors that each has a channel polarity that is a second polarity;
respective source terminals of the fourth to ninth transistors are connected to one of the power supply voltage and the reference voltage;
respective source terminals of the twelfth and thirteenth transistors are connected to another one of the power supply voltage and the reference voltage;
respective drain terminals of the fourth, sixth, and tenth transistors are connected to a first output terminal;
respective drain terminals of the fifth, seventh, and eleventh transistors are connected to a second output terminal;
a source terminal of the tenth transistor and respective drain terminals of the eighth and twelfth transistors are interconnected to each other;
a source terminal of the eleventh transistor and respective drain terminals of the ninth and thirteenth transistors are interconnected to each other;
the first control signal terminal is connected to respective gates of the fourth, eighth, and twelfth transistors; and
the second control signal terminal is connected to respective gates of the fifth, ninth, and thirteenth transistors.

5. The comparison circuit according to claim 4, further comprising:
a fourteenth transistor including a gate terminal to which the first control signal terminal is connected, a drain terminal connected to the second output terminal, and a source terminal connected to respective source terminals of the fourth to seventh transistors; and
a fifteenth transistor including a gate terminal to which the second control signal terminal is connected, a drain terminal connected to the first output terminal, and a source terminal connected to the respective source terminals of the fourth to seventh transistors.

6. The comparison circuit according to claim 5, wherein the fourteenth and fifteenth transistors are each a PMOS transistor.

7. The comparison circuit according to claim 5, wherein the fourteenth and fifteenth transistors are each an NMOS transistor.

8. The comparison circuit according to claim 4, wherein
the fourth to ninth transistors are each a PMOS transistor that has a P channel polarity; and
the tenth to thirteenth transistors are each an NMOS transistor that has an N channel polarity.

9. The comparison circuit according to claim 4, wherein at least a portion of the fourth to ninth transistors and the tenth to thirteenth transistors define an RS flip-flop.

10. The comparison circuit according to claim 4, wherein
the thirteenth transistor approaches a conduction state faster than the twelfth transistor; and
the fifth transistor approaches a non-conduction state faster than the fourth transistor.

11. The comparison circuit according to claim 4, wherein
the first transistor, the second transistor, and the fourth to ninth transistors are each an NMOS transistor, and
the tenth to thirteenth transistors are each a PMOS transistor.

12. The comparison circuit according to claim 2, wherein
the first transistor is a PMOS transistor; and
the second transistor is a PMOS transistor.

13. The comparison circuit according to claim 1, wherein the first control signal and the second control signal have waveforms that exhibit reversals to a low-level side with a falling edge timing of the clock signal and returns to a high-level side at speeds corresponding to magnitudes of the first input voltage and the second input voltage.

14. The comparison circuit according to claim 1, wherein the latch circuit operates in response to only the first control signal and the second control signal.

15. The comparison circuit according to claim 1, wherein the clock signal is the only clock signal supplied to the preliminary amplification circuit.

* * * * *